(12) United States Patent
Lu et al.

(10) Patent No.: US 10,411,078 B2
(45) Date of Patent: Sep. 10, 2019

(54) SENSING DISPLAY APPARATUS

(71) Applicant: Industrial Technology Research Institute, Hsinchu (TW)

(72) Inventors: Yi-Chuan Lu, Kinmen County (TW); Chih-Chia Chang, Hsinchu County (TW)

(73) Assignee: Industrial Technology Research Institute, Hsinchu (TW)

(*) Notice: Subject to any disclaimer, the term of this patent is extended or adjusted under 35 U.S.C. 154(b) by 96 days.

(21) Appl. No.: 15/473,623

(22) Filed: Mar. 30, 2017

(65) Prior Publication Data

US 2017/0207278 A1 Jul. 20, 2017

Related U.S. Application Data

(63) Continuation-in-part of application No. 14/586,447, filed on Dec. 30, 2014, now Pat. No. 10,025,435.

(30) Foreign Application Priority Data

Dec. 2, 2014 (TW) .............................. 103221337 U
Jan. 25, 2017 (TW) .............................. 106103034 A

(51) Int. Cl.
*H01L 27/32* (2006.01)
*G06F 3/044* (2006.01)
(Continued)

(52) U.S. Cl.
CPC ............ *H01L 27/323* (2013.01); *G06F 3/044* (2013.01); *H01L 51/5253* (2013.01);
(Continued)

(58) Field of Classification Search
CPC ..................... G06F 3/041; G06F 3/044; G06F 2203/04111; G06F 2203/04112; H01L 27/323; H01L 51/5253
(Continued)

(56) References Cited

U.S. PATENT DOCUMENTS 8,274,494 B2   9/2012   Frey et al.
8,564,556 B2   10/2013  Lee et al.
(Continued)

FOREIGN PATENT DOCUMENTS

CN   202887770   4/2013
CN   203178974   9/2013
(Continued)

OTHER PUBLICATIONS

"Office Action of Taiwan Counterpart Application," dated Aug. 18, 2017, p. 1-p. 3.
(Continued)

*Primary Examiner* — Jimmy H Nguyen
(74) *Attorney, Agent, or Firm* — JCIPRNET

(57) ABSTRACT

According an embodiment of the disclosure, a sensing display apparatus including a display panel, an encapsulation layer, a sensing circuit layer and a cover is provided. The display panel includes a display region. The encapsulation layer encapsulates the display panel, and a minimum thickness of the encapsulation layer ranges from 1 micrometer ($\mu m$) to 10 $\mu m$. The sensing circuit layer is disposed on the encapsulation layer. The ratio of a layout area of the sensing circuit layer to an area of the display region ranges from 3% to 15%. The encapsulation layer and the sensing circuit layer are covered by the cover and the thickness of the cover ranges from 10 $\mu m$ to 120 $\mu m$.

17 Claims, 6 Drawing Sheets

Related U.S. Application Data

(60) Provisional application No. 61/979,023, filed on Apr. 14, 2014.

(51) Int. Cl.
*H01L 51/52* (2006.01)
*H05K 1/02* (2006.01)
*G06F 3/041* (2006.01)

(52) U.S. Cl.
CPC .... *G06F 3/041* (2013.01); *G06F 2203/04111* (2013.01); *G06F 2203/04112* (2013.01); *H05K 1/0296* (2013.01); *H05K 1/0298* (2013.01)

(58) Field of Classification Search
USPC ......................................................... 345/174
See application file for complete search history.

(56) References Cited

U.S. PATENT DOCUMENTS

| | | | |
|---|---|---|---|
| 8,629,841 | B2 | 1/2014 | Degner et al. |
| 8,717,330 | B2 | 5/2014 | Lu et al. |
| 9,250,753 | B2 | 2/2016 | Westhues et al. |
| 9,276,055 | B1* | 3/2016 | Son ................... H01L 27/3276 |
| 2007/0132365 | A1 | 6/2007 | Kang et al. |
| 2008/0236905 | A1 | 10/2008 | Endo et al. |
| 2010/0007616 | A1 | 1/2010 | Jang |
| 2010/0123670 | A1 | 5/2010 | Philipp |
| 2010/0328248 | A1 | 12/2010 | Mozdzyn |
| 2011/0095996 | A1* | 4/2011 | Yilmaz ................... G06F 3/044 345/173 |
| 2011/0210937 | A1 | 9/2011 | Kee et al. |
| 2011/0227868 | A1 | 9/2011 | Chen et al. |
| 2012/0057270 | A1 | 3/2012 | Foerster |
| 2012/0249454 | A1* | 10/2012 | Teraguchi ............. G06F 3/0412 345/173 |
| 2012/0306777 | A1 | 12/2012 | Kang et al. |
| 2012/0327569 | A1 | 12/2012 | Park et al. |
| 2013/0038572 | A1 | 2/2013 | Frey et al. |
| 2013/0100053 | A1 | 4/2013 | Kang et al. |
| 2013/0162545 | A1 | 6/2013 | Kim et al. |
| 2013/0265247 | A1 | 10/2013 | Yang et al. |
| 2014/0070350 | A1* | 3/2014 | Kim ..................... G06F 3/044 257/432 |
| 2014/0104511 | A1 | 4/2014 | Liu et al. |
| 2014/0111709 | A1 | 4/2014 | Kim et al. |
| 2014/0198264 | A1 | 7/2014 | Gao et al. |
| 2015/0041778 | A1* | 2/2015 | Chang ................. H01L 27/3262 257/40 |
| 2016/0377770 | A1* | 12/2016 | Kwon .................... G02B 5/003 359/599 |
| 2017/0010738 | A1* | 1/2017 | Kurasawa ............ G06F 3/0416 |

FOREIGN PATENT DOCUMENTS

| | | |
|---|---|---|
| CN | 103425375 | 12/2013 |
| CN | 103472951 | 12/2013 |
| CN | 103530010 | 1/2014 |
| CN | 103713414 | 4/2014 |
| CN | 104423682 | 3/2015 |
| CN | 104750284 | 7/2015 |
| CN | 104750285 | 7/2015 |
| EP | 2985684 | 2/2016 |
| TW | M477575 | 5/2014 |
| TW | 201525830 | 7/2015 |
| TW | 201546670 | 12/2015 |

OTHER PUBLICATIONS

"Office Action of Taiwan Related Application, application No. 105140981", dated Nov. 15, 2017, p. 1-p. 9.

C. Guillén, et al.,"Comparison study of ITO thin films deposited by sputtering at room temperature onto polymer and glass substrates",Thin Solid Films, vol. 480-481, Jun. 1, 2005, pp. 129-132.

R.A. Synowicki,"Spectroscopic ellipsometry characterization of indium tin oxide film microstructure and optical constants",Thin Solid Films, vol. 313-314,Feb. 13, 1998, pp. 394-397.

Manil Kang et al.,"Optical Properties of Sputtered Indium-tin-oxide Thin Films",Journal of the Korean Physical Society, vol. 59, No. 5, Nov. 2011, pp. 3280-3283.

N. Ito et al.,"Electrical and optical properties of amorphous indium zinc oxide films",Thin Solid Films, vol. 496, Feb. 1, 2006, pp. 99-103.

C.G. Granqvist et al.;Transparent and conducting ITO films: new developments and applications, Thin Solid Films , vol. 411, May 22, 2002, pp. 1-5.

T. Minami et al.,"Physics of very thin IT0 conducting films with high transparency prepared by DC magnetron sputtering", Thin Solid Films, vol. 270,Dec. 1, 1995, pp. 37-42.

* cited by examiner

SENSING DISPLAY APPARATUS

CROSS-REFERENCE TO RELATED APPLICATION

This application is a continuation-in-part application of and claims the benefit of a U.S. application Ser. No. 14/586,447, filed Dec. 30, 2014, now pending, which claims the benefits of a U.S. provisional application Ser. No. 61/979,023, filed Apr. 14, 2014, and a Taiwan application Serial No. 103221337, filed Dec. 2, 2014. This application also claims the priority benefit of a Taiwan application Serial no. 106103034, filed on Jan. 25, 2017. The entirety of each of the above-mentioned patent applications is hereby incorporated by reference herein.

TECHNICAL FIELD

The disclosure relates to a sensing apparatus, and more particularly to a sensing display apparatus.

BACKGROUND

In recent years, the maturity in optoelectronic and semiconductor fabrication technologies motivates development in display panel. Display panels, such as liquid crystal display (LCD) panels, organic electroluminescence display (OELD) panels and so on, have been gradually accepted by users. Currently, display apparatuses keep being developed toward lightness and thinness, narrow bezel, high display quality, multi-function and so on. Besides the aforementioned development trends, display panels with powerful touch-sensing functionality bring the users with excellent use and operation convenience. In the current stage, touch-sensing techniques, according to different sensing methods thereof, can be roughly classified into a resistive sensing technique, a capacitive sensing technique, an optical sensing technique, an ultra-sonic sensing technique, an electromagnetic sensing technique and so on. Taking the capacitive sensing technique for example, it has advantages, such as quick response, preferable reliability and high durability, and can be widely applied to the display panels.

As the thickness of the sensing display apparatuses is continuously requested to be reduced, a distance between a sensing circuit layer and display pixels also must be reduced as well. The distance between the sensing circuit layer and the display pixels would result in influence on operational sensitivity of the sensing circuit layer.

SUMMARY

According to an embodiment, a sensing display apparatus including a display panel, an encapsulation layer, a sensing circuit layer and a cover is introduced herein. The display panel has a display region. The encapsulation layer encapsulates the display panel. A minimum thickness of the encapsulation layer ranges from 1 micrometer ($\mu m$) to 10 $\mu m$. The sensing circuit layer is disposed on the encapsulation layer. A ratio of a layout area of the sensing circuit layer to an area of the display region ranges from 3% to 15%. The cover covers the encapsulation layer and the sensing circuit layer, and a thickness of the cover ranges from 10 $\mu m$ to 120 $\mu m$.

According to another embodiment, a sensing display apparatus including a display panel, an encapsulation layer and a sensing circuit layer is introduced herein. The display panel has a display region and includes at least one conductive layer. The encapsulation layer encapsulates the display panel. The sensing circuit layer is disposed on the encapsulation layer, a ratio of a layout area of the sensing circuit layer to an area of the display region ranges from 3% to 15%, and a distance between the conductive layer and the sensing circuit layer ranges from 1 $\mu m$ to 10 $\mu m$.

According to yet another embodiment, a sensing display apparatus including a display panel, an encapsulation layer, a sensing circuit layer and a cover is introduced herein. The display panel has a display region and includes a first electrode layer, a second electrode layer and a display medium. The display medium is located between the first electrode layer and the second electrode layer. The encapsulation layer encapsulates the display panel, and the second electrode layer is located between the display medium and the encapsulation layer. The sensing circuit layer is disposed on the encapsulation layer. A ratio of a layout area of the sensing circuit layer to an area of the display region ranges from 3% to 15%. The sensing circuit layer includes a plurality of first sensing electrodes and a plurality of second sensing electrodes that are electrically insulated from each other. A distance between the sensing circuit layer and the second electrode layer ranges from 1 $\mu m$ to 10 $\mu m$. The cover covers the encapsulation layer and the sensing circuit layer and has sensing surface. A distance between the sensing circuit layer and the sensing surface of the cover ranges from 10 $\mu m$ to 120 $\mu m$.

Several exemplary embodiments accompanied with figures are described in detail below to further describe the disclosure in details.

DETAILED DESCRIPTION OF DISCLOSED EMBODIMENTS

First Embodiment

Figure 1:
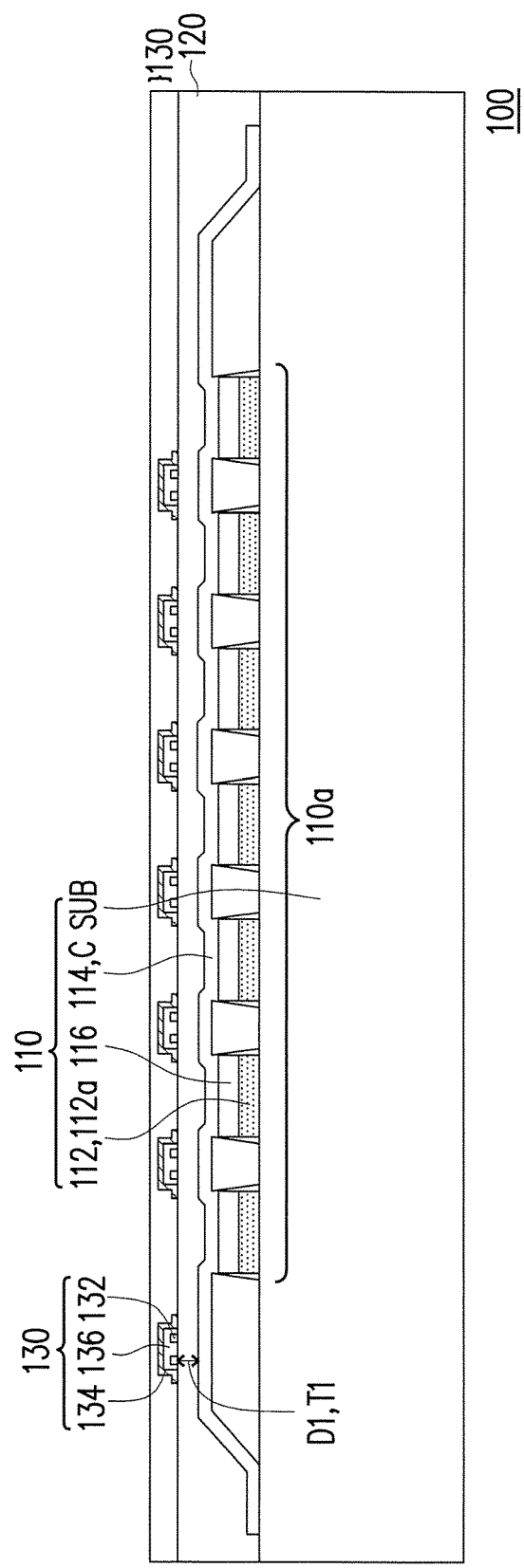
FIG. 1 is a schematic cross-sectional diagram illustrating a sensing display apparatus according to a first embodiment of the disclosure.
Figure 2:
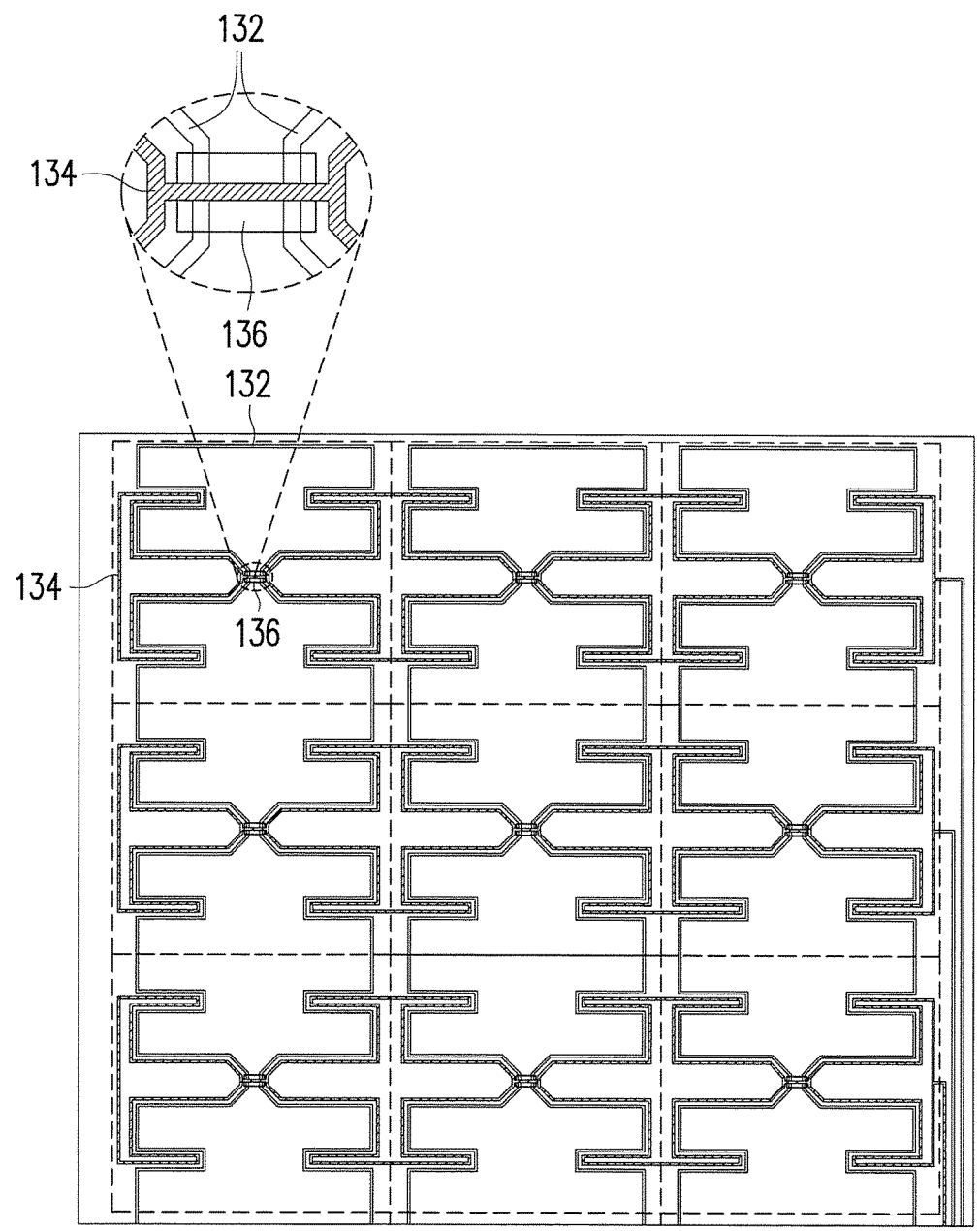
FIG. 2 is a schematic top-view diagram of a sensing circuit layer depicted in FIG. 1.

FIG. 1 is a schematic cross-sectional diagram illustrating a sensing display apparatus according to a first embodiment of the disclosure, and FIG. 2 is a schematic top-view diagram of a sensing circuit layer depicted in FIG. 1. Referring to FIG. 1 and FIG. 2, a sensing display apparatus 100 of the present embodiment includes a display panel 110, an encapsulation layer 120 and a sensing circuit layer 130. The display panel 110 has a display region 110a and includes at least one conductive layer C. The encapsulation layer 120 encapsulates the display panel 110. The sensing circuit layer 130 is disposed on the encapsulation layer 120, a ratio of a layout area of the sensing circuit layer 130 to an area of the display region 110a ranges from 3% to 15%, and a distance D1 between the conductive layer C and the sensing circuit layer 130 in the display panel 11 ranges from 1 micrometer (μm) to 10 μm. Herein, the layout area of the sensing circuit layer 130 refers to an area of a region in the sensing circuit layer 130 which actually has a sensing effect. In some embodiments, if the sensing circuit layer 130 includes dummy patterns, an area occupied by the dummy patterns is excluded from the calculation of the layout area of the sensing circuit layer 130.

In some embodiments, the display panel 110 may include a substrate SUB, a first electrode layer 112, a second electrode layer 114 and a display medium 116. The first electrode layer 112, the second electrode layer 114 and the display medium 116 are formed on the substrate SUB, the display medium 116 is located between the first electrode layer 112 and the second electrode layer 114, and the second electrode layer 114 is located between the display medium 116 and the encapsulation layer 120. For example, the aforementioned first electrode layer 112 may be an active device array including a plurality of anode patterns 112a (e.g. transparent pixel electrodes) arranged in an array, the aforementioned second electrode layer 114 may be a common cathode layer, and the display medium 116 may include an organic electroluminescent (OEL) layer. Taking the display panel 110 being an organic electroluminescent display (OELD) panel for example, the conductive layer C refers to one of the electrode layers in the display panel 110 which is more close to the encapsulation layer 120 or the sensing circuit layer 130, for example, the second electrode layer 114 illustrated in FIG. 1.

In some embodiments, the active device array may be a thin film transistor (TFT) array, and the TFT array may include a plurality of scan lines, a plurality of data lines and a plurality of pixels. Each pixel is electrically connected with its corresponding scan line and data line. Each pixel includes a driving circuit electrically which is connected with the corresponding scan line and data line and a pixel electrode which is electrically connected with the driving circuit. For example, the driving circuit may be, a 2T1C circuit structure consisting of two transistors and a capacitor, a 4T2C circuit structure consisting of four transistors and two capacitors or any other circuit structure consisting of transistors and capacitors in other numbers. Additionally, a material of the pixel electrodes may be a transparent conductive oxide (e.g., an indium tin oxide, an indium zinc oxide and so on).

In the organic electroluminescent display panel 110 illustrated in FIG. 1, a distribution range of the conductive layer C (i.e., the second electrode layer 114) usually corresponds to the display region 110a of the display panel 110, and a layout area of the conductive layer C (i.e., the second electrode layer 114) is slightly greater than or substantially equal to the area of the display region 110a of the display panel 110. The conductive layer C (i.e., the second electrode layer 114) in the display panel 110 is close to the sensing circuit layer 130 (for example, the distance D1 between the conductive layer C and the sensing circuit layer 130 ranges from 1 μm to 10 μm), and the conductive layer C (i.e., the second electrode layer 114) has a large layout area, and the conductive layer C (i.e., the second electrode layer 114) may probably influence operational sensitivity of the sensing circuit layer 130. In order to reduce the degree of the operational sensitivity of the sensing circuit layer 130 being influenced, the ratio of the layout area of the sensing circuit layer 130 to the area of the display region 110a is controlled to range from 3% to 15% in the present embodiment, so as to induce the sensing circuit layer 130 to generate sufficiently great capacitance (which ranges, for example, from 1 pF to 20 pF). In other words, when the ratio of the layout area of the sensing circuit layer 130 to the area of the display region 110a ranges from 3% to 15%, interference caused by the conductive layer C (i.e., the second electrode layer 114) to the sensing circuit layer 130 may be ignored. To follow, when the ratio of the layout area of the sensing circuit layer 130 to the area of the display region 110a ranges from 3% to 15%, obvious deterioration due to significant influence by the display panel 110 is prevented from occurring to the operational sensitivity of the sensing circuit layer 130.

As illustrated in FIG. 1, the display panel 110 and the sensing circuit layer 130 are respectively located at two opposite sides of the encapsulation layer 120. The minimum thickness T1 of the encapsulation layer 120 may determine the distance D1 between the conductive layer C and the sensing circuit layer 130. In some embodiments, the minimum thickness T1 of the encapsulation layer 120 ranges, for example, from 1 μm to 10 μm, and in this scenario, the distance D1 between the conductive layer C and the sensing circuit layer 130 is substantially equal to the minimum thickness T1 of the encapsulation layer 120. For example, the encapsulation layer 120 may include one or a plurality of dielectric layers with preferable resistance to water vapor and oxygen, and a water vapor transmission rate (WVTR) of the encapsulation layer 120 may be less than $10^{-1}$ g/m·day, for example, range from about $10^{-1}$ g/m²·day to about $10^{-6}$ g/m²·day.

In some embodiments, the sensing circuit layer 130 includes a plurality of first sensing electrodes 132 and a plurality of second sensing electrodes 134 that are electrically insulated from each other, and a distance between the first sensing electrodes 132 or the second sensing electrodes 134 and the conductive layer C (i.e., the second electrode layer 114) ranges from about 1 μm to about 10 μm. Herein, the layout area of the sensing circuit layer 130 is an area occupied by the first sensing electrodes 132 and the second sensing electrodes 134. As illustrated in FIG. 1, the first sensing electrodes 132 in the sensing circuit layer 130 are electrically insulated from one another, the second sensing electrodes 134 in the sensing circuit layer 130 are electrically insulated from one another, the first sensing electrodes 132 intersect the second sensing electrodes 134, and each of the first sensing electrode 132 and each of the second sensing electrodes 134 are electrically insulated from each other at intersections thereof by insulation patterns 136.

In some embodiments, the first sensing electrodes 132 and the second sensing electrodes 134 may be formed by a transparent conductive oxide layer (e.g., an indium tin oxide layer, an indium zinc oxide layer or the like) and a plurality of bridge lines (e.g., metal bridge lines). The transparent conductive oxide layer is electrically insulated from the bridge lines by the insulation patterns 136. In other embodiments, the first sensing electrodes 132 and the second sensing electrodes 134 may be formed by two transparent conductive oxide layers (e.g., indium tin oxide layers, an indium zinc oxide layers and so on) that are electrically insulated from each other by the insulation patterns 136. In some alternative embodiments, the first sensing electrodes 132 and the second sensing electrodes 134 may be formed by metals layers. It should be noted that the fabrication of the first sensing electrodes 132 and the second sensing electrodes 134 may be modified or changed based on actual design requirements, and the embodiments of the disclosure are not limited to the aforementioned designs.

Figure 3:
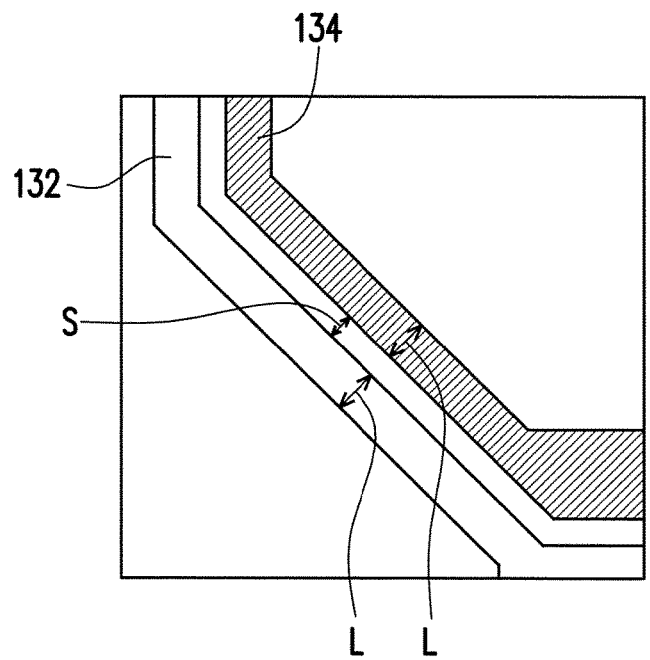
FIG. 3 is a partial schematic diagram illustrating a first sensing electrode and its corresponding second sensing electrode.

FIG. 3 is a partial schematic diagram illustrating a first sensing electrode and its corresponding second sensing electrode. Referring to FIG. 3, in some embodiments, the first sensing electrode 132 and the second sensing electrode 134 may be in a form of conductive traces and extend along a predetermined path, and the first sensing electrode 132 substantially keeps a fixed spacing S from the corresponding second sensing electrode 134. For example, the first sensing electrode 132 and the second sensing electrode 134 may have the same line width L ranging from about 50 μm to about 70 μm, and the spacing S between the first sensing electrode 132 and the corresponding second sensing electrode 134 may range from about 50 μm to about 80 μm. In some embodiments, a ratio of the minimum thickness T1 of the encapsulation layer 120 (or the distance D1) to the spacing S may range from about 1:50 to about 1:80. In other embodiments, a ratio of the line width L to the spacing S may range from about 1:0.5 to about 0.9.

Figure 4:
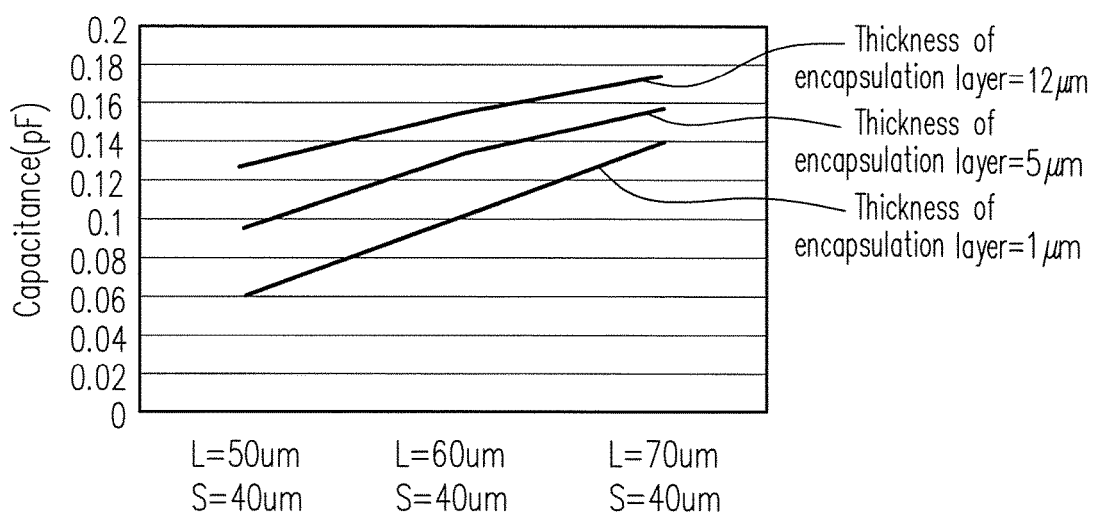
FIG. 4 is a chart illustrating the relation among the line width of the first sensing electrode and the second sensing electrode, the minimum thickness of the encapsulation layer and the generated capacitance.

FIG. 4 is a chart illustrating the relation among the line width of the first sensing electrode and the second sensing electrode, the minimum thickness of the encapsulation layer and the generated capacitance. Referring to FIG. 4, in a condition that the spacing S (which is 40 μm, for example) between the first sensing electrode 132 and the corresponding second sensing electrode 134 and the minimum thickness T1 of the encapsulation layer 120 are fixed, the greater the line width L of the first sensing electrode 132 and the second sensing electrode 134 is, the greater the capacitance generated between the first sensing electrode 132 and the second sensing electrode 134 is. In addition, as the spacing S (e.g., 40 μm) and the line width L are fixed, the smaller the minimum thickness T1 of the encapsulation layer 120 is, the smaller the capacitance generated between the first sensing electrode 132 and the second sensing electrode 134 is.

According to FIG. 4, when the thickness of the sensing display apparatus 100 is requested to reduce, the minimum thickness T1 of the encapsulation layer 120 may also be requested to reduce, and thus, the capacitance generated between the first sensing electrode 132 and the second sensing electrode 134 is reduced due to the reduction of the minimum thickness T1 of the encapsulation layer 120. In this circumstance, the line width L of the first sensing electrodes 132 and the second sensing electrodes 134 in the sensing circuit layer 130 is required to be large enough, so as to generate large sufficient capacitance. In the embodiments described above, when the ratio of the layout area of the sensing circuit layer 130 to the area of the display region 110a ranges from 3% to 15%, sufficient capacitance may be generated between the first sensing electrodes 132 and the second sensing electrodes 134, so as to maintain the operational sensitivity of the sensing circuit layer 130.

Second Embodiment

Figure 5A:
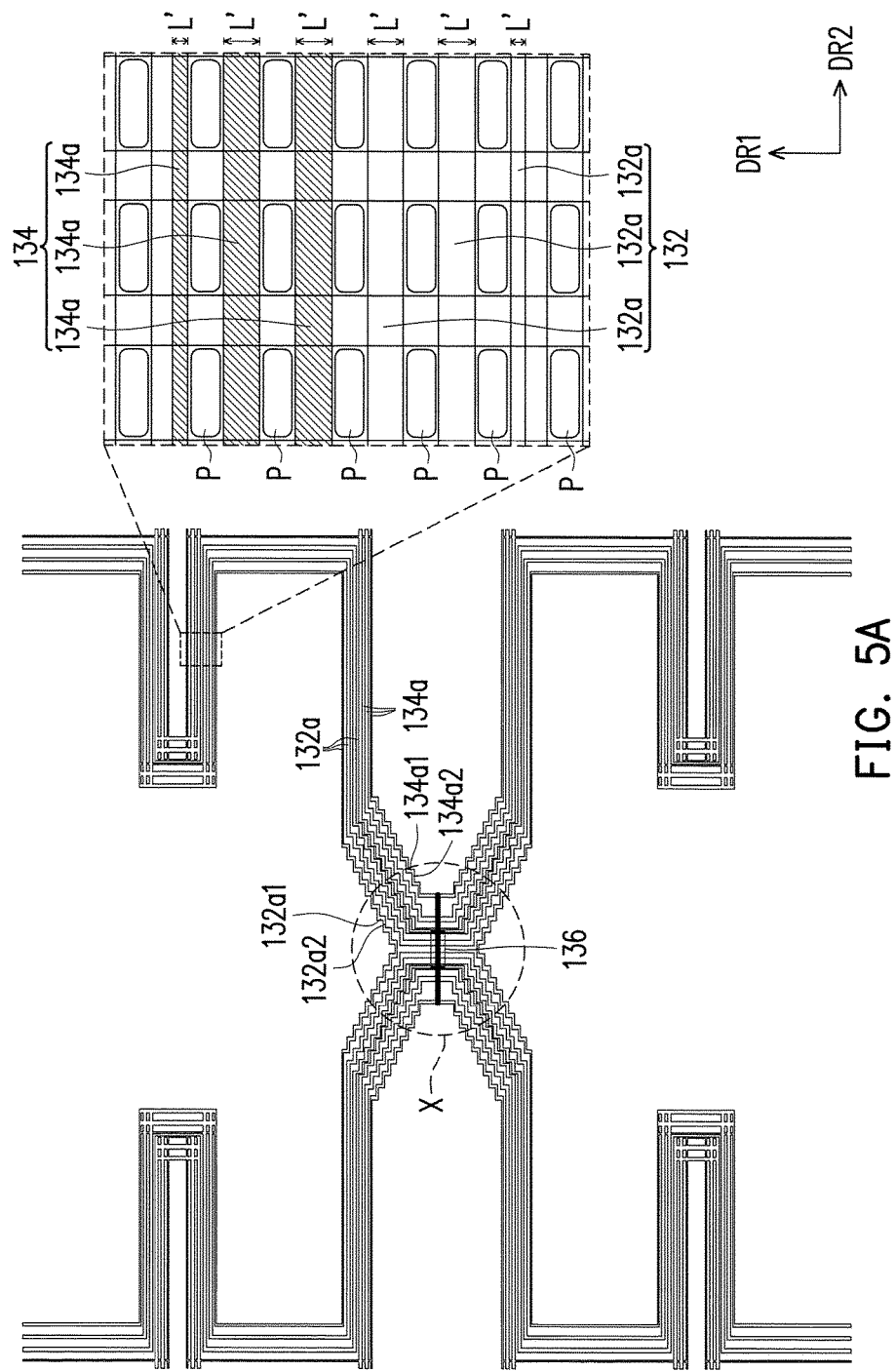
FIG. 5A is a schematic top-view diagram illustrating first sensing electrodes, second sensing electrodes and pixels according to a second embodiment of the disclosure.
Figure 5B:
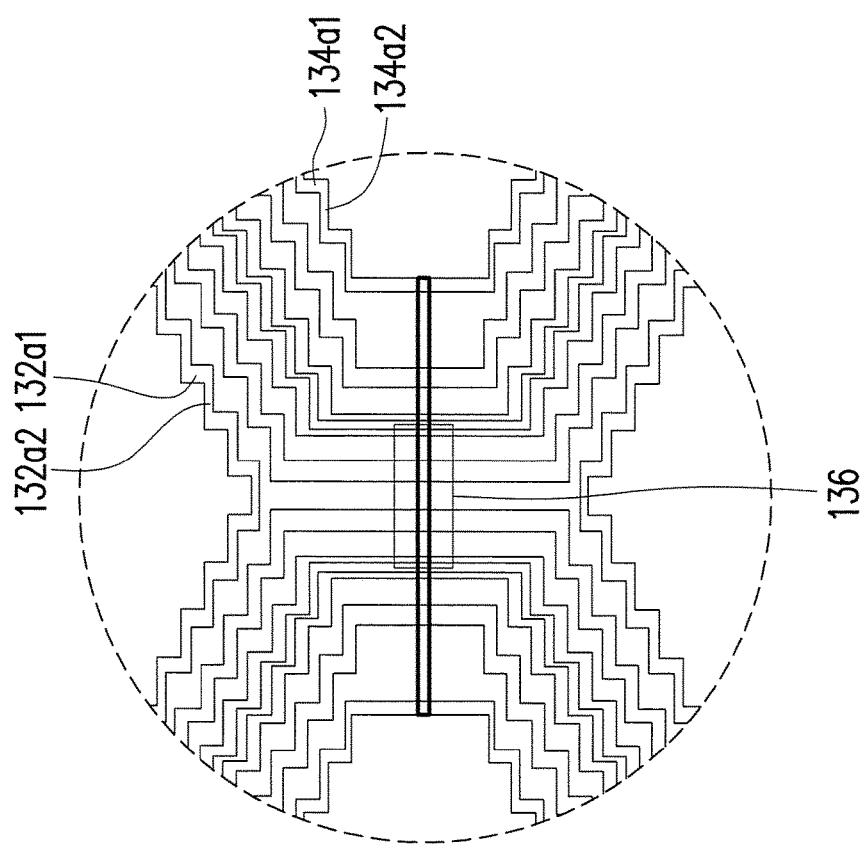
FIG. 5B is a partially enlarged schematic diagram of a position X depicted in FIG. 5A.

FIG. 5A is a schematic top-view diagram illustrating first sensing electrodes, second sensing electrodes and pixels according to a second embodiment of the disclosure, and FIG. 5B is a partially enlarged schematic diagram of a position X depicted in FIG. 5A. Referring to FIG. 5A and FIG. 5B, in the present embodiment, in order to mitigate the visual influence to the display panel 110 caused by the sensing circuit layer 130, the first sensing electrodes 132 and the second sensing electrodes 134 in the sensing circuit layer 130 may be laid out in positions which do not overlap positions of pixels P in the display panel 110. For example, the first sensing electrodes 132 and the second sensing electrodes 134 in the form of conductive traces may be distributed correspondingly to regions between adjacent pixels P, without shielding the pixels P, and the pixels P may be arranged in an array, for example.

As illustrated in FIG. 5A and FIG. 5B, in order to generate sufficiently large capacitance between each first sensing electrode 132 and its corresponding second sensing electrode 134, the line width L (as illustrated in FIG. 4) of the first sensing electrode 132 and the second sensing electrode 134 is required to be large enough. However, in case the line width L of the first sensing electrode 132 and the second sensing electrode 134 is greater than a region width between adjacent pixels P, the first sensing electrodes 132 and the second sensing electrodes 134 inevitably overlap the pixels P and as a result, the overall vision of the display panel 110 is influenced. Thus, in the present embodiment, a plurality of first conductive traces 132a which have a smaller line width L' and are connected with each other may be used to form the first sensing electrodes 132, and/or a plurality of second conductive traces 134a which have the smaller line width L' and are connected with each other may be used to form the second sensing electrodes 134. Herein, the line width L' of the first conductive traces 132a and the second conductive traces 134a is in principle not greater than the region width between the pixels P, and the distribution of the first conductive traces 132a and the second conductive traces 134a does not overlap the pixels P.

As illustrated in FIG. 5A, the pixels P of the display panel 110 may be arranged in an array along a column direction DR1 and a row direction DR2. The first conductive traces 132a forming the first sensing electrodes 132 are respectively formed by a plurality of patterns 132a1 extending along the column direction DR1 and a plurality of patterns 132a2 extending along the row direction DR2. In the same way, the second conductive traces 134a forming the second sensing electrodes 134 are respectively formed by a plurality of patterns 134a1 extending along the column direction DR1 and a plurality of patterns 134a2 extending along the row direction DR2.

Referring to FIG. 5A and FIG. 5B, in a proximity area of the intersections of the first sensing electrodes 132 and the second sensing electrodes 134, the first conductive traces 132a and the second conductive traces 134a may have step-like patterns, and the step-like patterns are formed by the aforementioned patterns 132a2, 134a2, 132a1 and 134a1. Accordingly, the step-like patterns may facilitate keeping the first sensing electrodes 132 and the second sensing electrodes 134 from overlapping the pixels P.

Third Embodiment

Figure 6:
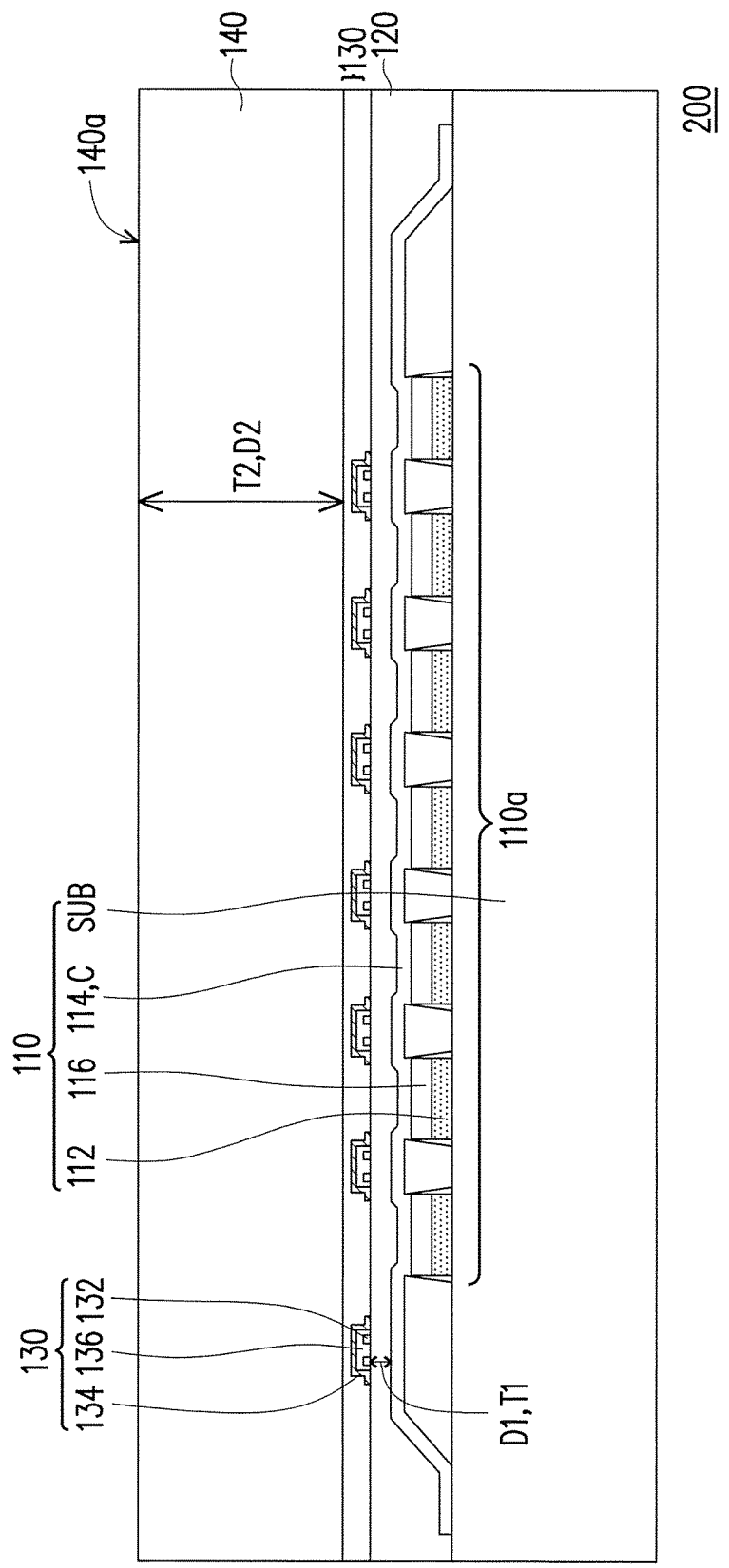
FIG. 6 is a schematic cross-sectional diagram illustrating a sensing display apparatus according to an embodiment of the disclosure.

FIG. 6 is a schematic cross-sectional diagram illustrating a sensing display apparatus according to an embodiment of the disclosure. Referring to FIG. 6, a sensing display apparatus 200 of the present embodiment is similar to the sensing display apparatus 100 of the first embodiment, but the sensing display apparatus 200 further includes a cover 140 covering the encapsulation layer 120 and the sensing circuit layer 130. A thickness T2 of the cover 140 ranges from 10 μm to 120 μm. In other embodiments, the thickness T2 of the cover 140 ranges, for example, from 12 μm to 60 μm.

The thickness T2 of the cover 140 determines a distance D2 between the first sensing electrodes 132 and a sensing surface 140a of the cover 140 or the distance D2 between the second sensing electrodes 134 and the sensing surface 140a of the cover 140. In some embodiments, other thin films do not have to be provided between the cover 140 and the sensing circuit layer 130, and thus, the distance D2 may be substantially equal to the thickness T2 of the cover 140 (which ranges from 10 μm to 120 μm, for example). In other embodiments, other thin films (e.g., an adhesive layer, a barrier layer, a protection layer, and so on) may be provided between the cover 140 and the sensing circuit layer 130, thus, the distance D2 may be greater than the thickness T2 of the cover 140, and the distance D2 keeps ranging from 10 μm to 120 μm.

It should be noted that the design of the first sensing electrodes 132 and the second sensing electrodes 134 in the second embodiment (i.e., the embodiment illustrated in FIG. 5A and FIG. 5B) may be applied to the sensing display apparatuses 100 and 200 of the embodiments of the disclosure.

It will be clear that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A sensing display apparatus, comprising:
   a display panel, having a display region, and comprising a plurality of pixels distributed within the display region;
   an encapsulation layer, encapsulating the display panel, wherein a minimum thickness of the encapsulation layer ranges from 1 micrometer (μm) to 10 μm;
   a sensing circuit layer, disposed on the encapsulation layer, the sensing circuit layer comprising a plurality of first sensing electrodes and a plurality of second sensing electrodes, the first sensing electrodes and the second sensing electrodes being respectively in a form of conductive traces extending along a path, and a line width of each of the conductive traces being not greater than a region width between the pixels, wherein the first sensing electrodes and the second sensing electrodes are spread in the sensing circuit layer to cover a portion of the display region, and a ratio of an area occupied by the first and second sensing electrodes to a total area of the display region ranges from 3% to 15%, and wherein a fixed spacing separating one first sensing electrode from a corresponding one second sensing electrode is S, the line width of the each of the conductive traces is L, and a ratio of L to S ranges from 1:0.5 to 1:0.9; and
   a cover, covering the encapsulation layer and the sensing circuit layer, wherein a thickness of the cover ranges from 10 μm to 120 μm.

2. The sensing display apparatus according to claim 1, wherein the display panel comprises a first electrode layer, a second electrode layer and a display medium, the display medium is located between the first electrode layer and the second electrode layer, and the second electrode layer is located between the display medium and the encapsulation layer.

3. The sensing display apparatus according to claim 2, wherein the display panel comprises an organic electroluminescent display (OELD) panel, the first electrode layer comprises an active device array, the active device array comprises a plurality of anode patterns arranged in array, the second electrode layer comprises a common cathode layer, and the display medium comprises an organic electroluminescent (OEL) layer.

4. The sensing display apparatus according to claim 1, wherein the encapsulation layer comprises at least one dielectric layer.

5. The sensing display apparatus according to claim 1, wherein the first sensing electrodes and the second sensing electrodes of the sensing circuit layer do not overlap the pixels.

6. The sensing display apparatus according to claim 1, wherein the cover has a sensing surface, and a distance between the sensing circuit layer and the sensing surface of the cover is determined by the thickness of the cover.

7. A sensing display apparatus, comprising:
   a display panel, having a display region, comprising a plurality of pixels distributed within the display region, and comprising at least one conductive layer;
   an encapsulation layer, encapsulating the display panel; and
   a sensing circuit layer, disposed on the encapsulation layer, the sensing circuit layer comprising a plurality of first sensing electrodes and a plurality of second sensing electrodes, the first sensing electrodes and the second sensing electrodes being respectively in a form of conductive traces extending along a path, and a line width of each of the conductive traces being not greater than a region width between the pixels, wherein the first sensing electrodes and the second sensing electrodes are spread in the sensing circuit layer to cover a portion of the display region, and a ratio of an area occupied by the first and second sensing electrodes to a total area of the display region ranges from 3% to 15%, and a distance between the conductive layer and the sensing circuit layer ranges from 1 μm to 10 μm, and wherein a fixed spacing separating one first sensing electrode from a corresponding one second sensing electrode is S, the line width of the each of the conductive traces is L, and a ratio of L to S ranges from 1:0.5 to 1:0.9.

8. The sensing display apparatus according to claim 7, wherein the first sensing electrodes and the second sensing electrodes are electrically insulated from each other, and a distance between the first sensing electrodes or the second sensing electrodes and the conductive layer ranges from 1 μm to 10 μm.

9. The sensing display apparatus according to claim 8, wherein the first sensing electrodes and the second sensing electrodes do not overlap the pixels.

10. The sensing display apparatus according to claim 7, wherein the display panel comprises an organic electroluminescent display (OELD) panel, and the conductive layer comprises a common cathode layer.

11. The sensing display apparatus according to claim 7, wherein the encapsulation layer comprises at least one dielectric layer.

12. The sensing display apparatus according to claim 7, further comprising:
    a cover, covering the encapsulation layer and the sensing circuit layer, and having a sensing surface.

13. The sensing display apparatus according to claim 12, wherein a distance between the sensing circuit layer and the sensing surface is determined by the thickness of the cover.

14. A sensing display apparatus, comprising:
    a display panel, having a display region, comprising a plurality of pixels distributed within the display region, and comprising a first electrode layer, a second electrode layer and a display medium, wherein the display medium is located between the first electrode layer and the second electrode layer;

an encapsulation layer, encapsulating the display panel, and the second electrode layer being located between the display medium and the encapsulation layer;

a sensing circuit layer, disposed on the encapsulation layer, the sensing circuit layer comprising a plurality of first sensing electrodes and a plurality of second sensing electrodes, the first sensing electrodes and the second sensing electrodes being respectively in a form of conductive traces extending along a path, and a line width of each of the conductive traces being not greater than a region width between the pixels, wherein the first sensing electrodes and the second sensing electrodes are spread in the sensing circuit layer to cover a portion of the display region, and a ratio of an area occupied by the first and second sensing electrodes to a total area of the display region ranges from 3% to 15%, the sensing circuit layer comprises a plurality of first sensing electrodes and a plurality of second sensing electrodes that are electrically insulated from each other, and a distance between the sensing circuit layer and the second electrode layer ranges from 1 μm to 10 μm, and wherein a fixed spacing separating one first sensing electrode from a corresponding one second sensing electrode is S, the line width of the each of the conductive traces is L, and a ratio of L to S ranges from 1:0.5 to 1:0.9; and a cover, covering the encapsulation layer and the sensing circuit layer, and having a sensing surface, wherein a distance between the sensing circuit layer and the sensing surface of the cover ranges from 10 μm to 120 μm.

15. The sensing display apparatus according to claim 14, wherein the display panel comprises an organic electroluminescent display (OELD) panel, the first electrode layer comprises an active device array, the active device array comprises a plurality of anode patterns arranged in an array, the second electrode layer comprises a common cathode layer, and the display medium comprises an organic electroluminescent (OEL) layer.

16. The sensing display apparatus according to claim 14, wherein the first sensing electrodes and the second sensing electrodes do not overlap the pixels.

17. The sensing display apparatus according to claim 14, wherein the encapsulation layer comprises at least one dielectric layer.

\* \* \* \* \*